US007425238B2

(12) United States Patent
Muto et al.

(10) Patent No.: US 7,425,238 B2
(45) Date of Patent: Sep. 16, 2008

(54) SUBSTRATE HOLDING DEVICE

(75) Inventors: Yasuyo Muto, Tochigi (JP); Yukio Takabayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/682,962

(22) Filed: Oct. 14, 2003

(65) Prior Publication Data

US 2004/0150172 A1 Aug. 5, 2004

(30) Foreign Application Priority Data

Oct. 16, 2002 (JP) ............................. 2002-301648

(51) Int. Cl.
*B23B 31/30* (2006.01)
*H01L 21/683* (2006.01)
*C33C 16/00* (2006.01)

(52) U.S. Cl. .................... 118/728; 156/345.51; 269/21; 279/3; 118/500

(58) Field of Classification Search ................. 118/500, 118/728; 269/29, 3; 355/73, 76; 279/21; 156/345.51

See application file for complete search history.

(56) References Cited

U.S. PATENT DOCUMENTS 5,324,012 A * 6/1994 Aoyama et al. ............... 269/21
5,923,408 A * 7/1999 Takabayashi ................ 355/53
6,137,562 A 10/2000 Masuyuki et al. ............. 355/73
6,184,972 B1 2/2001 Mizutani et al. .............. 355/72
6,320,736 B1 * 11/2001 Shamouilian et al. ....... 361/234
6,426,790 B1 7/2002 Hayashi ....................... 355/72
6,664,549 B2 * 12/2003 Kobayashi et al. ..... 250/440.11
6,762,826 B2 * 7/2004 Tsukamoto et al. ........... 355/72
6,809,802 B1 * 10/2004 Tsukamoto et al. ........... 355/72
2004/0036850 A1 * 2/2004 Tsukamoto et al. ........... 355/72

(Continued)

FOREIGN PATENT DOCUMENTS

JP 62-221130 9/1987

(Continued)

OTHER PUBLICATIONS

Korean Office Action dated Sep. 23, 2005, issued in a corresponding Korean patent application, No. 10-2003-0072036.

(Continued)

*Primary Examiner*—Sylvia R. MacArthur
(74) *Attorney, Agent, or Firm*—Fitzpatrick, Cella, Harper & Scinto

(57) ABSTRACT

Disclosed is a wafer chuck, which has protrusions for supporting a substrate, for attracting and holding the substrate by negative pressure while the substrate is being supported by the protrusions. The wafer chuck includes pin-shaped protrusions dispersed on a suction side of the chuck, and circular peripheral wall portions disposed in the vicinity of the rim of the supported substrate and in the vicinity of the outer peripheral portion of a lifting hole, respectively. The suction side of the wafer chuck is provided with a first area in which the pin-shaped protrusions are arrayed in a grid-line manner, and a second area in which the pin-shaped protrusions are arrayed in circumferential form. The second area is provided in the vicinity of the peripheral wall portion and peripheral wall portion, and the first area is provided elsewhere.

17 Claims, 6 Drawing Sheets

U.S. PATENT DOCUMENTS

2004/0150172 A1* 8/2004 Muto et al. .................... 279/3

FOREIGN PATENT DOCUMENTS

| | | |
|---|---|---|
| JP | 5-235151 | 9/1993 |
| JP | 05-235151 | 9/1993 |
| JP | 06-132387 | 5/1994 |
| JP | 08-031719 | 2/1996 |
| JP | 8-195428 | 7/1996 |
| JP | 2574818 | 10/1996 |
| JP | 08-316294 | 11/1996 |
| JP | 10-50810 | 2/1998 |
| JP | 10-233433 | 9/1998 |
| JP | 2821678 | 9/1998 |
| JP | 2001-60617 | 3/2001 |

OTHER PUBLICATIONS

Japanese Office Action dated Aug. 3, 2007, issued in corresponding Japanese patent application No. 2002-301648, with an English translation.

* cited by examiner

SUBSTRATE HOLDING DEVICE

FIELD OF THE INVENTION

This invention relates to a substrate holding device for holding a substrate serving as a workpiece. More particularly, the invention relates to a substrate holding device used in a semiconductor manufacturing apparatus, a liquid-crystal substrate manufacturing apparatus, a magnetic-head manufacturing apparatus, a micromachine manufacturing apparatus, and the like. Also, the invention relates to an exposure apparatus and a device manufacturing method using such a substrate holding device.

BACKGROUND OF THE INVENTION

The growth of the sophisticated information-oriented society in recent years has been accompanied by rapid advances in the manufacture of finer and more highly integrated elements. Lenses of higher numerical apertures are being used in order to deal with the manufacture of finer elements in demagnifying projection exposure systems used in the manufacture of semiconductor devices. Though resolution rises owing to use of higher numerical apertures, however, effective focal depth decreases with an increase in numerical aperture and higher integration. In order to assure a sufficiently practical focal depth while maintaining resolving power, it is necessary to mitigate curvature of the image surface in the projection optical system, improve upon uniformity of substrate thickness and raise the precision of the chuck plane.

A method that minimizes the rate of contact between the underside of a wafer and the vacuum-retention side of a chuck is adopted conventionally as effective means for suppressing element defects ascribable to foreign matter. In particular, a pin-contact-type chuck that comes into point contact with the underside of the wafer is becoming increasingly in vogue.

The structure of an ordinary pin chuck is illustrated in FIG. 2. The ordinary pin chuck has an annular seal 14 on its outer circumference and a multiplicity of 0.2-mm circular or square pin-shaped contact portions (referred to also as "pin-shaped protrusions" below) 12 dispersed inwardly of the seal at a pin pitch of 2 mm. Further, in general, the circumferential seal 14 and a seal portion 13 of a hole 11 for a substrate lifting pin each define a continuous, embankment-like peripheral wall. When this pin chuck is used, three problems ascribable to vacuum-induced deformation arise.

The first problem is wafer flexure that occurs between the pin-shaped protrusions. In a case wherein a wafer is held by suction through pin-like contact, flexure occurs owing to the action of an external deforming force caused by the suction force of the vacuum with regard to the pin-to-pin intervals. For example, if pin spacing is 2 mm, flexure on the order of 5 nm occurs. This amount of flexure is not negligible in view of the specifications that will be demanded of exposure systems in the future owing to the use of higher numerical apertures and shorter wavelengths.

The second problem is doming deformation ascribable to wafer flexure that occurs at the portion of the lifting-pin hole 11. As a result of such deformation, a large dome in excess of 100 nm is caused by wafer deformation between the peripheral wall portion of the seal for the lifting-pin hole and the adjoining pins, flexure of the pins themselves and digging of the pins into the wafer.

The third problem is lift-up, which occurs for reasons similar to those of the problems above, between the seal wall (14) at the outer circumference of the chuck and the adjacent pins. The circumferential portion undergoes a large amount of lift-up produced because wafer deformation acts on the free end. There are cases where this lift-up exceeds 300 nm.

In order to deal with the first problem, it has been attempted to array the chuck protrusions in the form of a grid or concentric circles and reduce the spacing between the pins. However, if the pins are brought closer together by reducing pin spacing in order to reduce flexure between the pins, the amount of flexure decreases but the rate of contact with the underside of the wafer increases, thereby elevating the probability that foreign matter will intrude.

This type of deformation between pins does not exhibit positional correlation with respect to the exposure viewing angle of the exposure apparatus. As a consequence, pin contact position differs for every exposure viewing angle and deformed shape ascribable to deformation between the pins is not reproduced from one exposure shot to the next. As a result, the amount of variation in focus increases for every exposure viewing angle. Usually, in an exposure apparatus that performs exposure using a square or rectangular angle of view, the above-mentioned variation is more pronounced with the concentric circular array than with the grid-type array.

With regard to the second and third problems, the prior art is such that a decline in planarity at the time of vacuum-induced suction becomes conspicuous at the periphery of the hole for the substrate lifting pin near the center of the chuck. For this reason, it has been proposed to provide the seal portion with a difference in level (e.g., see the specification of Japanese Patent Application Laid-Open No. 10-233433), and a chuck in which all contacting portions employ point contact also has been proposed (e.g., see the specification of Japanese Patent Application Laid-Open No. 8-195428). These chucks are such that the peripheral wall portion of the seal for assuring vacuum is formed to be one level lower than the tops of the pins, and a plurality of protuberances are provided on the peripheral wall portion. In each of these examples of the prior art, however, leakage at the peripheral wall portion is a problem and various difficulties arise, such as a decline in vacuum pressure and loss of a plane correcting force at the rim of a wafer that exhibits a large amount of curvature. In addition, in order to lower the peripheral wall portion with stabilized dimensions, highly precise partial machining is required. This results in higher manufacturing cost.

Accordingly, in view of the state of the prior art set forth above, there is a need for the provision of a chuck in which excellent planarity is obtained between pins, in the vicinity of the lifting pin and at the rim of the chuck.

SUMMARY OF THE INVENTION

According to one aspect of the present invention, there is provided a substrate holding chuck, which has protrusions for supporting a substrate, for attracting and holding the substrate by negative pressure while the substrate is being supported by the protrusions, the protrusions including: a plurality of pin-shaped protrusions provided on a vacuum surface; and a circular first peripheral wall portion disposed in the vicinity of an outer circumferential portion of the suction surface; the chuck further having: a first area in which the pin-shaped protrusions are arrayed in circumferential form in the vicinity of the first peripheral wall portion; and a second area, disposed inwardly of the first area, in which the pin-shaped protrusions are arrayed in a grid-like manner.

Preferably, the pitch at which the pin-shaped protrusions are placed in the grid-like array is a fraction of the size of the exposure viewing angle of an exposure apparatus. Flexure caused by an external deforming force ascribable to the suction force of the pin-shaped protrusions can be provided with reproducibility on a per-exposure-shot basis, and focusing accuracy between shots can be stabilized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate an embodiment of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Embodiment of an Exposure Apparatus

An embodiment of the invention will now be described in concrete terms using an example in which a substrate holding device according to the present invention is applied to a demagnifying projection exposure apparatus.

Figure 4:
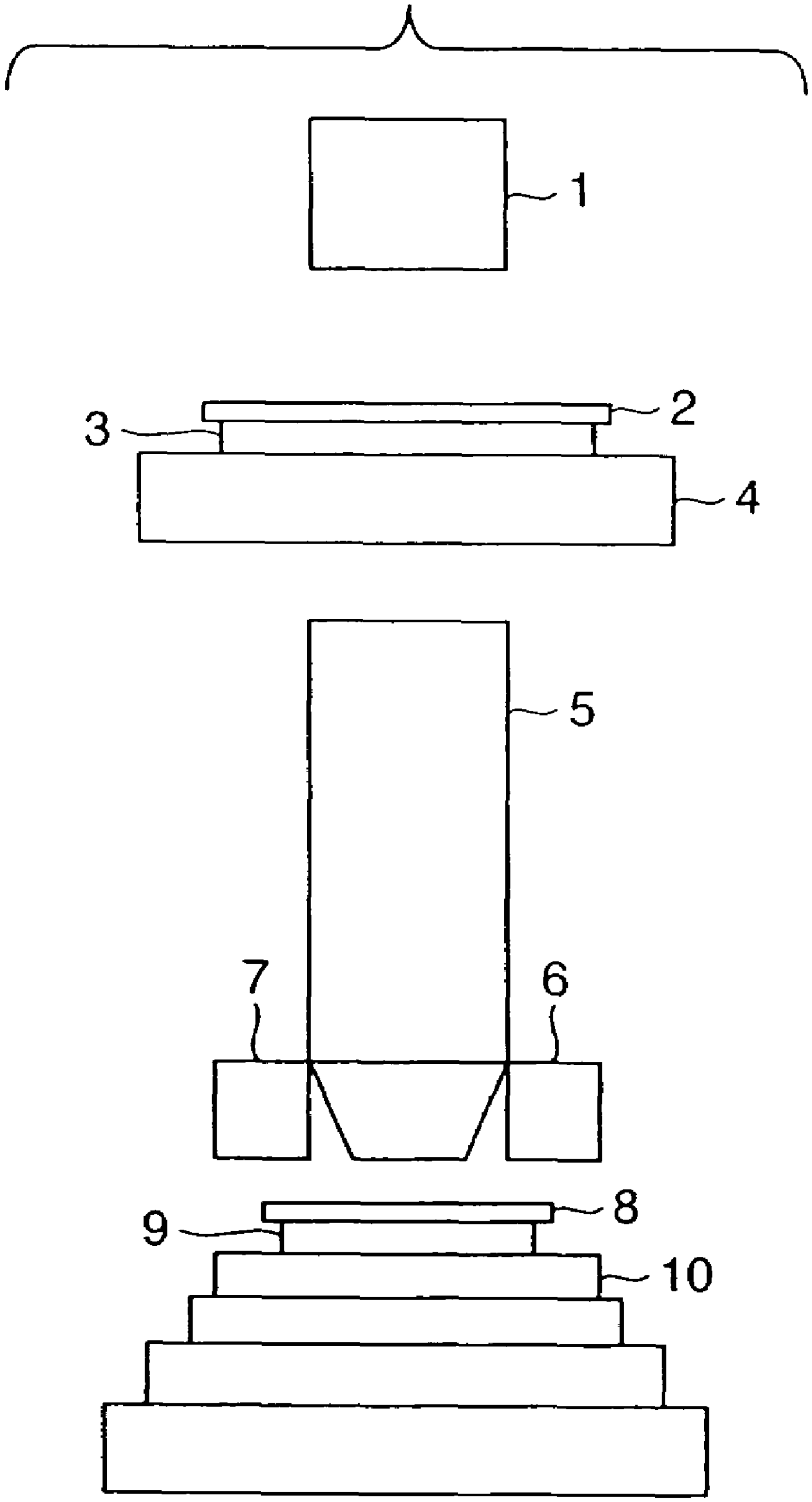
FIG. 4 is a diagram showing the general structure of an exposure apparatus according to this embodiment.

FIG. 4 is an overall schematic view of an exposure apparatus. As shown in FIG. 4, the exposure apparatus is such that a reticle 2, which is an exposure master, is placed on a reticle stage 4 via a reticle chuck 3. The reticle 2 is irradiated with exposing light guided to it from a light source (not shown) via an illuminating optical system 1. The exposing light that has passed through the reticle 2 is demagnified to, e.g., one-fifth the size by a projection optical system 5 and illuminates a silicon wafer 8, which is the workpiece. A so-called wafer chuck 9, namely a substrate holding device serving as means for holding the silicon wafer 8, is mounted on an XY stage 10 that is capable of moving the wafer in a horizontal plane.

An exposure sequence in the exposure apparatus constructed as set forth above will now be described.

Once the silicon wafer 8 to be exposed has been set in the exposure apparatus automatically or manually by an operator, operation of the exposure apparatus starts in response to an exposure-start command. A first wafer 8 is fed into the wafer chuck 9, which has been mounted on the stage 10, by a conveyance system. Next, alignment marks inscribed on the wafer 8 are detected at a plurality of locations by an off-axis scope 7, wafer magnification, rotation and amount of XY shift are determined and position is corrected. The stage 10 moves the wafer in such a manner that a first shot position of the mounted wafer will agree with the exposure position of the exposure apparatus. After focusing is achieved by surface measurement means 6, exposure is carried out for about 0.2 s, the wafer is stepped to a second shot position on the wafer and exposure is repeated in succession. Processing for exposure of one wafer is completed by repeating a similar sequence up to the final shot. The wafer delivered from the wafer chuck to a recovery transport hand is returned to a wafer carrier.

Embodiment of a Wafer Chuck

Figure 1:
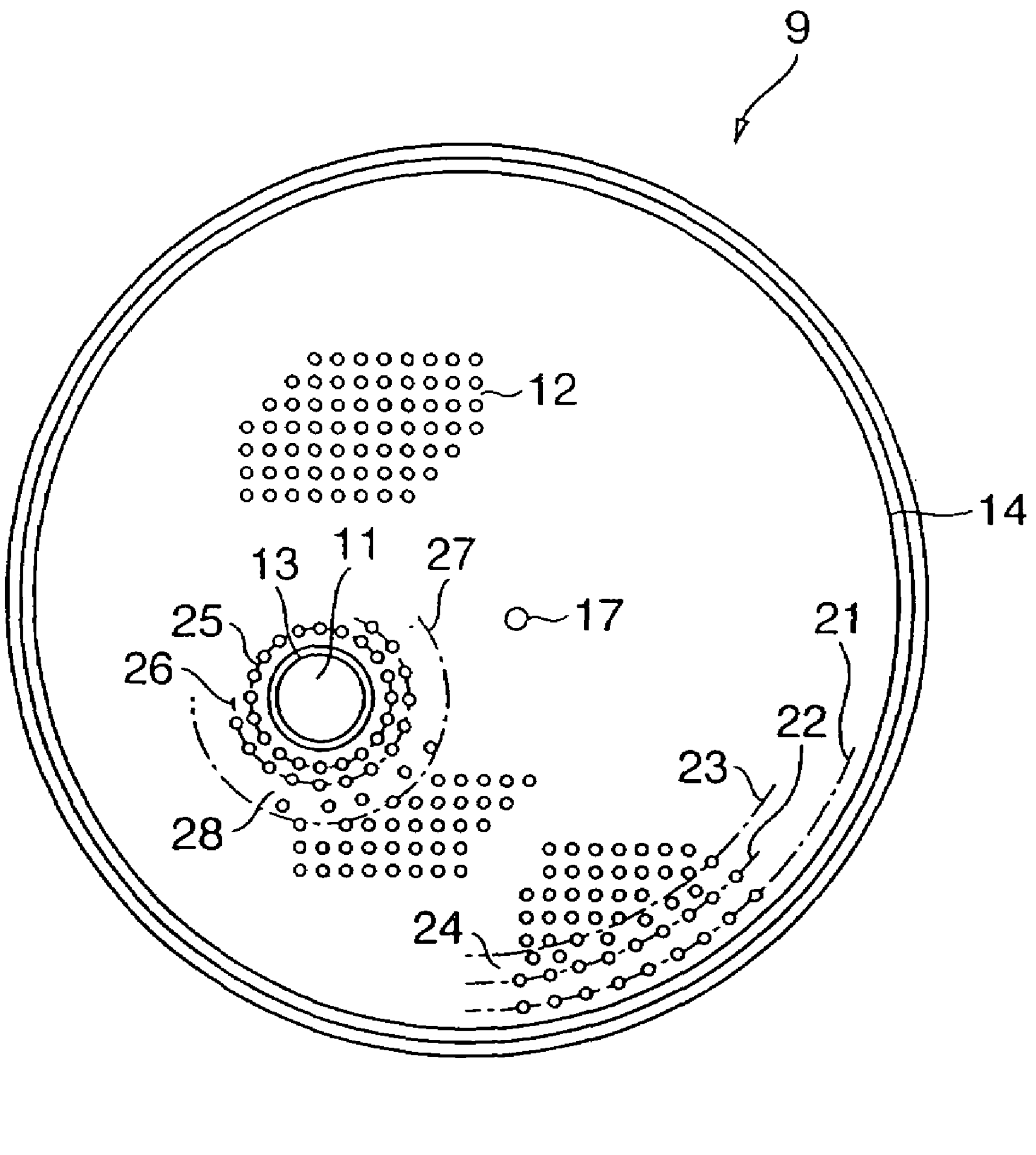
FIG. 1 is a diagram illustrating the external appearance of a wafer chuck according to an embodiment of the present invention.
Figure 2:
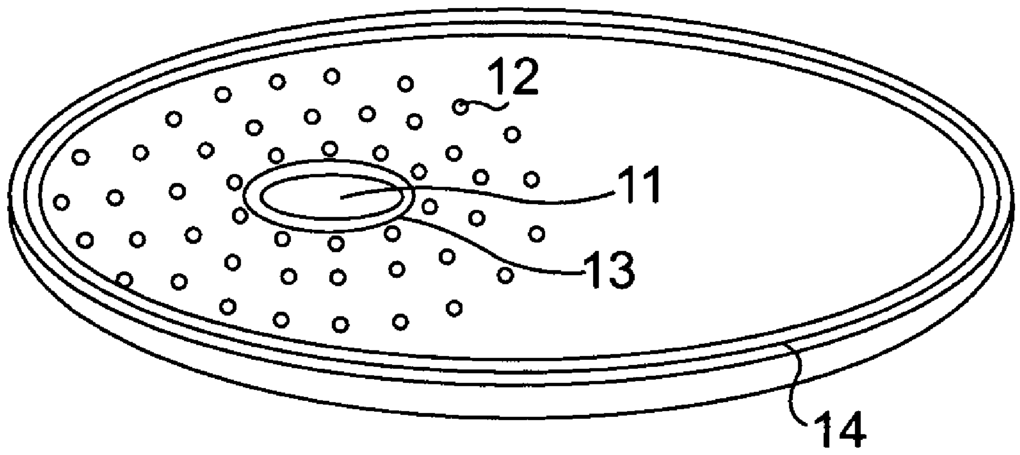
FIG. 2 PRIOR ART
FIG. 2 is a diagram illustrating the external appearance of an ordinary wafer chuck.
Figure 3:
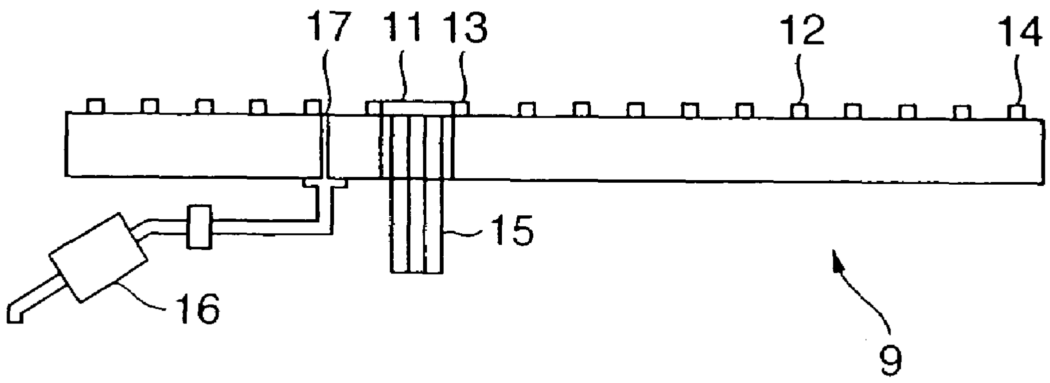
FIG. 3 is a sectional view illustrating the wafer chuck according to this embodiment.

FIGS. 1 and 3 illustrate the general features of the wafer chuck 9 according to this embodiment. The wafer chuck 9 comprises a sintered SiC ceramic that excels in thermal conductivity. The top side of the wafer chuck 9 on which a wafer is placed has the pin-shaped protrusions 12, which are formed by etching, and embankment-like peripheral wall portions 13, 14. The underside of the chuck is formed to have one or a plurality of vacuum suction holes 17 that pass through to the top side and communicate with a vacuum source. When a wafer is mounted on the chuck 9 and operated on, it is required that a lifting pin 15, which is moved up and down in order to lift the wafer up from the chuck 9 temporarily, be caused to penetrate the chuck 9 at a point midway along its radius. For this reason, the chuck 9 has the through-hole (lifting-pin hole) 11 the diameter of which is greater than that of the lifting pin 15. The peripheral wall portion 13, which is formed to have a width that is substantially equal to the diameter of the pin-shaped protrusions, is provided surrounding the lifting-pin hole 11. Similarly, the peripheral wall portion 14, which has a diameter slightly smaller than the outer diameter of the wafer, is provided on the circumferential portion of the chuck 9.

These peripheral wall portions should have a height the same as that of the pin-shaped protrusions 12. Of course, the plane correcting ability will not decline even if the height of the peripheral wall portions is made slightly less, as in the prior art. It should be noted that an exhaust hole 17 is provided to attract the wafer by vacuum suction, as well as an exhaust pump 16 connected to the exhaust hole 17.

Next, an area in which the pin-shaped protrusions 12 are arrayed in grid-like form will be described.

In the exposure apparatus according to this embodiment, a single exposure area is assumed to be 22×22 mm owing to lens limitations. The pin-shaped protrusions 12 are arranged in a grid array at a spacing that is a value obtained by dividing the exposure viewing angle by an integer (1/10 of the viewing angle, or 2.2 mm in this embodiment) in such a manner that even when the wafer is stepped to the neighboring shot and exposed, the relative positions of the pin-shaped protrusions 12 will coincide as seen from the lens. Thus, the shape of deformation caused by sandwiching the wafer between the pin-shaped protrusions is reproduced at every exposure shot and defocusing accuracy between shots becomes more stable. If the vacuum pressure is reduced further, a pitch larger than 2.2 mm can be selected and the contact rate can be reduced. In this embodiment, the pin-shaped protrusions 12 are arranged in a simple orthogonal grid-like array. However, if selection of a correlated arrangement with respect to the exposure viewing angle is taken into consideration, a staggered-type grid array may be adopted without departing from the gist of the present invention.

Next, the arrangement of the pin-shaped protrusions in the vicinity of the peripheral wall portion 14 at the rim of the chuck 9 will be described.

If the grid-like array were adopted even in the vicinity of the rim of the chuck 9, portions with many of the pin-shaped protrusions and portions with few of the pin-shaped protrusions would occur adjacent to the peripheral wall portion 14. As a result, this would foster vacuum deformation of the wafer and bring about the lift-up phenomenon. Accordingly, the pin-shaped protrusions are arranged in a plurality of concentric circles in the vicinity of the peripheral wall portion 14. According to this embodiment, two concentric circles of the pin-shaped protrusions are provided. Further, a transition area is provided inwardly of the innermost circle of pin-shaped protrusions to achieve a smooth transition from the grid area to the area of concentric circles.

Preferably, the arrangement of the concentric circles, the arrangement of the pin-shaped protrusions on the concentric circles, the arrangement of the transition area and the arrangement of the pin-shaped protrusions inside the transition area are decided based upon a pitch P of the pin-shaped protrusions arrayed in the grid pattern on the inner side. The inventors have discovered that if the pins are arranged in this manner, a major improvement in flatness can be achieved.

First, it is preferred that the position of a first circle 21 nearest to the peripheral wall portion 14 be selected within a range that satisfies the relation $0.2P \leqq A \leqq 1.2P$, where A represents distance from the peripheral wall portion 14. In this embodiment, 2.2 mm, which is equivalent to 1.0×P, is adopted. Accordingly, spacing D of the pin-shaped protrusions disposed on the first circle 21 is made 2.2 mm, which is the same as P. It should be noted that D preferably falls within the range $0.8P \leqq D \leqq 1.2P$.

Next, a second circle 22 is placed at a position located a distance B inwardly of the first circle 21. Here B is selected within a range that satisfies the relation $0.8P \leqq B \leqq 1.2P$. In this embodiment, 2.2 mm (=1.0P) is adopted. Further, it is preferred that a spacing D' of pin-shaped protrusions disposed on the second circle 22 be selected within a range that satisfies the relation $0.8P \leqq D' \leqq 1.2P$. In this embodiment, D'=2.2 mm is adopted.

Furthermore, a third circle 23 is placed at a position located a distance P inwardly of the second circle 22. An area 24 between the second circle 22 and third circle 23 is adopted as the transition area. The pin-shaped protrusions 12 are formed into a grid array of pitch 2.2. mm on the inner side of the third circle 23. In the transition area 24, the pin-shaped protrusions 12 are arranged in accordance with an array rule described below.

First, the area S of the transition area 24 is found and a value ($S/P^2$), which is the result of dividing the area S by the grid area $P^2$ of grid pitch P, is adopted as the optimum number of pins in the transition area 24. In this embodiment, an integral value close to $S/P^2$ is adopted as the number of pins and this is the number of pin-shaped protrusions provided. It is preferred that the pin-shaped protrusions 12 in the transition area 24 be arranged in such a manner that a distance E between mutually adjacent pin-shaped protrusions satisfies the relation $0.7P \leqq E \leqq 1.2P$.

A rule similar to the above-described pin arrangement rule regarding the peripheral wall portion 14 at the circumference of the chuck can be applied also to the vicinity of the lifting-pin hole 11 provided at the center of the chuck.

First, a first circle 25 (a circle that is concentric with respect to the peripheral wall portion 13) nearest to the peripheral wall portion 13 encircling the lifting-pin hole 11 is provided. If a represents the distance from the peripheral wall portion 13, the position of the lifting pin 15 preferably is selected within a range that satisfies the relation $0.3P \leqq a \leqq 0.6P$. In this embodiment, 1.1 mm, which is equivalent to 0.5P, is adopted. Spacing d of the pin-shaped protrusions disposed on the first circle 25 preferably is selected within a range that satisfies the relation $0.8P \leqq d \leqq 1.2P$. In this embodiment, it is assumed that the spacing d is 2.2 mm, which is the same as P.

Next, a second circle 26 is placed at a position located a distance b outwardly of the first circle 25. Here b is selected within a range that satisfies the relation $0.8P \leqq b \leqq 1.2P$. In this embodiment, 2.2 mm is adopted.

Furthermore, a third circle 27 is placed at a position located a distance P outwardly of the second circle 26. An area 28 between the second circle 26 and third circle 27 is adopted as a transition area 28.

The pin-shaped protrusions in the transition area 28 are arranged as follows: The area s of the transition area 28 is found and a value ($s/P^2$), which is the result of dividing the area s by the grid area $P^2$ of grid pitch P, is adopted as the optimum number of pins in the transition area 28. Accordingly, an integral number of the pin-shaped protrusions 12 close to this value is placed inside the transition area 28. Preferably, the placement of the pin-shaped protrusions 12 in the transition area 28 is such that the distance e mutually adjacent pin-shaped protrusions will satisfy the relation $0.7P \leqq E \leqq 1.2P$.

By placing the pin-shaped protrusions based upon the rule described above, wafer flexure between pins when the wafer is attracted by suction can be made uniform, the supporting force offered by the individual pins can be made approximately the same value and it is possible to make uniform, over the entirety of the chuck, the amount of flexure of the pins themselves and the amount by which the pins dig into the underside of the wafer.

It should be noted that the present invention is not limited to the chuck of an exposure apparatus and is applicable also to an apparatus that applies and develops a resist. In particular, if the present invention is applied under identical conditions to a chuck, referred to as a “spin chuck”, of the spinning portion of a wafer, a high degree of flatness can be obtained.

<Device Production Method>

Described next will be an embodiment of a method of producing a device utilizing the exposure apparatus or exposure method set forth above.

Figure 5:
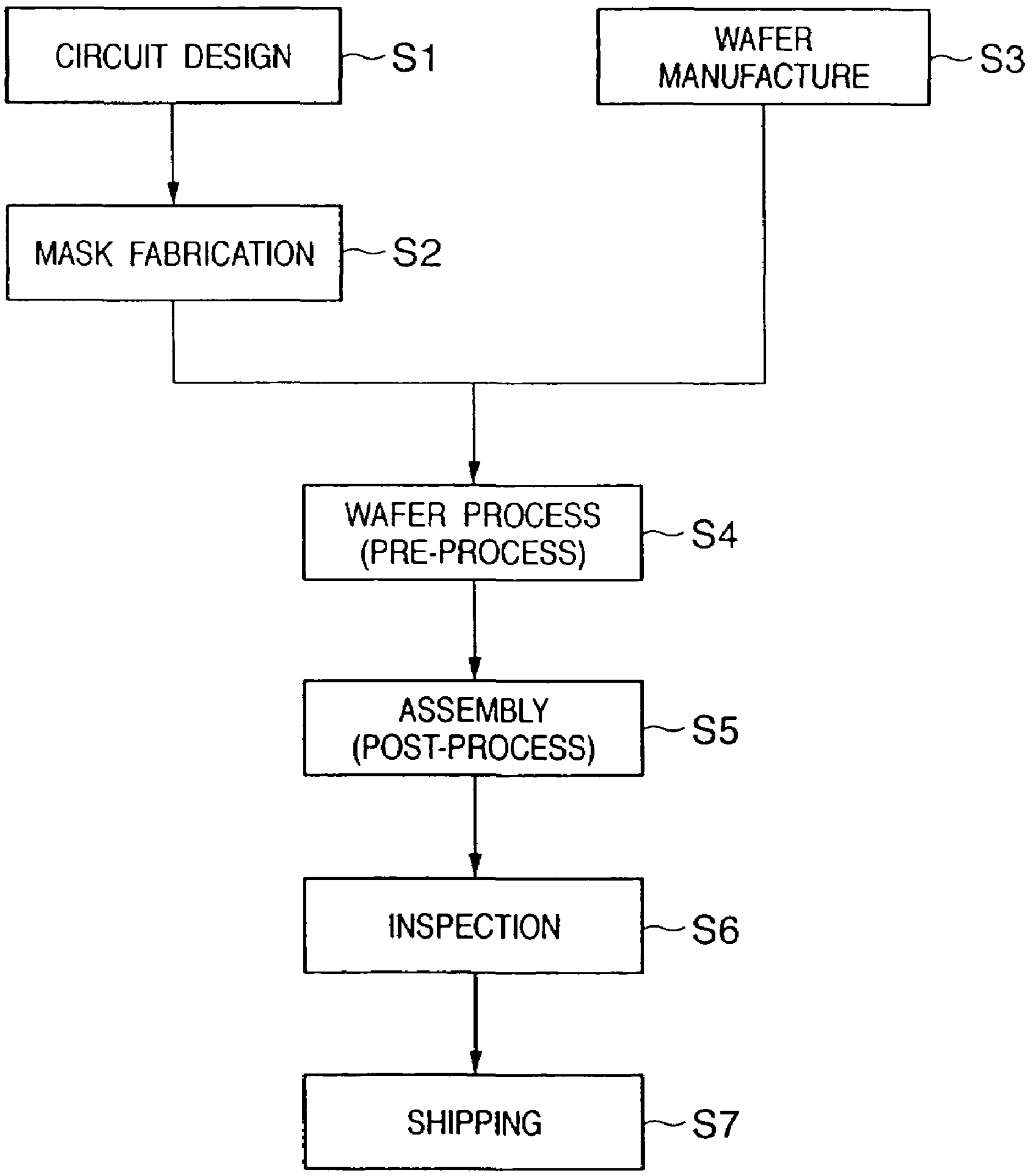
FIG. 5 is a flowchart showing the manufacture of a microdevice.

FIG. 5 is a flowchart illustrating the manufacture of a microdevice (a semiconductor chip such as an IC or LSI chip, a liquid crystal panel, a CCD, a thin-film magnetic head, a micromachine, etc.).

The pattern for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the reticle and substrate that have been prepared, at step 4 (wafer process), which is also referred to as “pre-treatment”. A semiconductor chip is obtained, using the wafer fabricated at step 4, at step 5 (assembly), which is also referred to as “post-treatment”. This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7).

Figure 6:
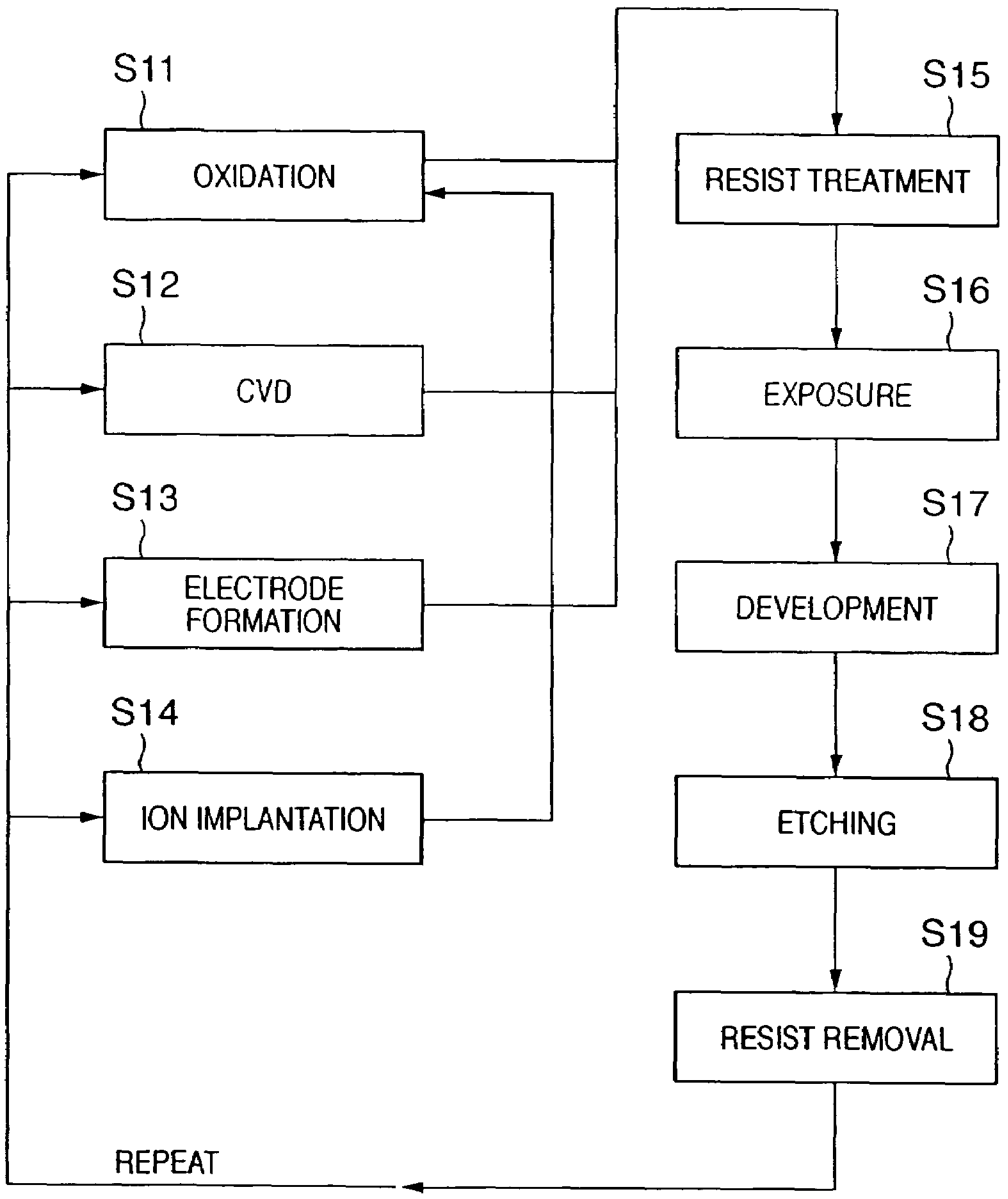
FIG. 6 is a flowchart showing the details of a wafer process.

FIG. 6 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the manufacturing method of this embodiment is used, it will be possible to stably produce semiconductor devices having a high degree of integration. Such devices have been difficult to manufacture heretofore.

Thus, in accordance with the present invention as described above, highly precise flatness is obtained over the entire suction area of a chuck, and excellent vacuum-induced suction is produced even with regard to wafers exhibiting curvature.

As many apparently widely different embodiments of the present invention can be made without departing from the spirit and scope thereof, it is to be understood that the invention is not limited to the specific embodiments thereof except as defined in the appended claims.

What is claimed is:

1. A substrate holding chuck, which has protrusions for supporting a substrate, for holding the substrate by negative pressure while the substrate is being supported by said protrusions, said protrusions including:

(a) a circular first peripheral wall portion disposed along an outer circumferential portion of the chuck; and (b) a plurality of pin-shaped protrusions inside said circular first peripheral wall portion, said chuck having:

(i) a first area, disposed inwardly of and along said circular first peripheral wall portion, in which said pin-shaped protrusions are arrayed in one or more concentric circles having a center identical with a center of said circular first peripheral wall portion;

(ii) a second area, disposed inwardly of said first area, in which said pin-shaped protrusions are arrayed in a grid-like manner; and (iii) a third area, which is disposed between said first and second areas, in which arrangement of said pin-shaped protrusions is different from the concentric circle and the grid-like manner, and said pin-shaped protrusions are arrayed to provide a substantially uniform supporting force, wherein a spacing D at which said pin-shaped protrusions are arranged in a concentric circle in said first area satisfies the relation $0.8P \leqq D \leqq 1.2P$, where P represents a pitch at which said pin-shaped protrusions are arrayed in the grid-like manner in said second area.

2. The chuck according to claim 1, wherein a pitch at which said pin-shaped protrusions are arrayed in the grid-like manner is a value obtained by dividing the size of an exposure viewing angle of an exposure apparatus by an integer.

3. The chuck according to claim 1, wherein a difference A between the radius of said circular first peripheral wall portion and the radius of a concentric circle that is nearest to said circular first peripheral wall portion satisfies the relation $0.2P \leqq A \leqq 1.2P$, where P represents a pitch at which said pin-shaped protrusions are arrayed in the grid-like manner in said second area.

4. The chuck according to claim 1, wherein said third area is an area defined by a first concentric circle that is an innermost concentric circle in said first area, and a second concentric circle located inwardly of said innermost concentric circle.

5. The chuck according to claim 4, wherein a difference between radii of the first and second concentric circles that decide said third area is equal to the pitch at which said pin-shaped protrusions are arrayed in the grid-like manner in said second area.

6. The chuck according to claim 1, wherein the number of pin-shaped protrusions disposed in said third area is decided based upon $S/P^2$, where S represents the area of said third area and P represents a pitch at which said pin-shaped protrusions are arrayed in the grid-like manner in said second area.

7. The chuck according to claim 1, further comprising:

a portion having a through-hole through which a lifting member for separating the substrate from a holding surface is capable of being passed;

a second peripheral wall portion for supporting the substrate at the periphery of said portion having the through-hole;

a fourth area in which said pin-shaped protrusions are arrayed in circumferential form at the periphery of said second peripheral wall portion;

a fifth area, which is disposed between said fourth and second areas, in which arrangement of said pin-shaped protrusions is different from the circumferential form and the grid-like manner, and said pin-shaped protrusions are arrayed to provide a substantially uniform supporting force.

8. The chuck according to claim 7, wherein said pin-shaped protrusions are disposed in said fourth area on one or a plurality of concentric circles having a center identical with a center of said second peripheral wall portion.

9. The chuck according to claim 8, wherein a difference a between the radius of said second peripheral wall portion and the radius of a concentric circle that is nearest to said second peripheral portion satisfies the relation $0.3P \leqq a \leqq 0.6P$, where P represents a pitch at which said pin-shaped protrusions are arrayed in the grid-like manner in said second area.

10. The chuck according to claim 8, wherein a difference b between radii of a plurality of concentric circles in said fourth area satisfies the relation $0.8P \leqq b \leqq 1.2P$, where P represents a pitch at which said pin-shaped protrusions are arrayed in a grid-like manner in said second area.

11. The chuck according to claim 7 wherein said pin-shaped protrusions are disposed in said fourth area on one or a plurality of concentric circles having a center identical with a center of said second peripheral wall portion; and said fifth area is an area defined by a concentric circle that is an outermost concentric circle in said fourth area, and a concentric circle located outwardly of said outermost concentric circle.

12. The chuck according to claim 11, wherein a difference between radii of the two concentric circles that decide said fifth area is equal to the pitch at which said pin-shaped protrusions are arrayed in the grid-like manner in said first area.

13. The chuck according to claim 7, wherein the number of pin-shaped protrusions disposed in said fifth area is decided based upon $S/P^2$, where S represents the area of said fifth area and P represents a pitch at which said pin-shaped protrusions are arrayed in the grid-like manner in said second area.

14. The chuck according to claim 7, wherein arrangement of said pin-shaped protrusions in said fifth area is such that a distance e between mutually adjacent pin-shaped protrusions satisfies the relation $0.7P \leqq e \leqq 1.2P$, where P represents a pitch at which said pin-shaped protrusions are arrayed in the grid-like manner in said second area.

15. An exposure apparatus having the substrate holding chuck set forth in claim 7, said exposure apparatus executing exposure processing with respect to a substrate held by said substrate holding chuck.

16. A substrate holding chuck, which has protrusions for supporting a substrate, for holding the substrate by negative pressure while the substrate is being supported by said protrusions, said protrusions including:

(a) a circular first peripheral wall portion disposed along an outer circumferential portion of the chuck; and (b) a plurality of pin-shaped protrusions inside said circular first peripheral wall portion, said chuck having:

(i) a first area, disposed inwardly of and along said circular first peripheral wall portion, in which said pin-shaped protrusions are arrayed in one or more concentric circles having a center identical with a center of said circular first peripheral wall portion;

(ii) a second area, disposed inwardly of said first area, in which said pin-shaped protrusions are arrayed in a grid-like manner; and (iii) a third area, which is disposed between said first and second areas, in which arrangement of said pin-shaped protrusions is different from the concentric circle and the grid-like manner, and said pin-shaped protrusions are arrayed to provide a substantially uniform supporting force, wherein arrangement of said pin-shaped protrusions in said third area is such that a distance E between mutually adjacent pin-shaped protrusions satisfies the relation 0.7P≦E≦1.2P, where P represents a pitch at which said pin-shaped protrusions are arrayed in the grid-like manner in said second area.

17. A substrate holding chuck, which has protrusions for supporting a substrate, for holding the substrate by negative pressure while the substrate is being supported by said protrusions, said protrusions including:

(a) a circular first peripheral wall portion disposed along an outer circumferential portion of the chuck; and (b) a plurality of pin-shaped protrusions inside said circular first peripheral wall portion, said chuck having:

(i) a first area, disposed inwardly of and along said circular first peripheral wall portion, in which said pin-shaped protrusions are arrayed in one or a plurality of concentric circles having a center identical with a center of said circular first peripheral wall portion;

(ii) a second area disposed inwardly of said first area, in which said pin-shaped protrusions are arrayed in a grid-like manner; and (iii) a third area, which is disposed between said first and second areas, in which arrangement of said pin-shaped protrusions is different from the concentric circle and the grid-like manner, and said pin-shaped protrusions are arrayed based on a pitch of an array of said pin-shaped protrusions, wherein a spacing D at which said pin-shaped protrusions are arranged in a concentric circle in said first area satisfies the relation 0.8P≦D≦1.2P, where P represents a pitch at which said pin-shaped protrusions are arrayed in the grid-like manner in said second area.

* * * * *